United States Patent [19]
Okuzawa et al.

[11] Patent Number: 5,243,538
[45] Date of Patent: Sep. 7, 1993

[54] COMPARISON AND VERIFICATION SYSTEM FOR LOGIC CIRCUITS AND METHOD THEREOF

[75] Inventors: Osamu Okuzawa, Hadano; Kazuhiko Matsumoto, Yokohama; Yukio Ikariya, Hiratsuka; Hiroshi Mochizuki, Hadano, all of Japan

[73] Assignee: Hitachi, Ltd., Tokyo, Japan

[21] Appl. No.: 563,492

[22] Filed: Aug. 7, 1990

[30] Foreign Application Priority Data

Aug. 9, 1989 [JP] Japan .................................. 1-206090

[51] Int. Cl.⁵ .............................................. G06F 15/60
[52] U.S. Cl. ...................................... 364/489; 364/488
[58] Field of Search ................ 364/488, 489, 490, 491

[56] References Cited

U.S. PATENT DOCUMENTS

| | | | |
|---|---|---|---|
| 4,591,993 | 5/1986 | Griffin et al. | 364/491 |
| 4,758,953 | 7/1988 | Morita et al. | 364/490 |
| 4,792,909 | 12/1988 | Serlet | 364/491 |
| 4,803,636 | 2/1989 | Nishiyama et al. | 364/491 |
| 4,896,272 | 1/1990 | Kurosawa | 364/491 |
| 4,922,432 | 5/1990 | Kobayashi et al. | 364/490 |
| 4,942,536 | 7/1990 | Watanabe et al. | 364/490 |
| 4,967,367 | 10/1990 | Piednoir | 364/489 |
| 5,038,294 | 8/1991 | Arakawa et al. | 364/491 |
| 5,067,091 | 11/1991 | Nakazawa | 364/490 |

OTHER PUBLICATIONS

"Binary Decision Diagrams" by S. B. Akers, IEEE Trans. on Computers, vol. C-27, No. 6, Jun. 1978, pp. 509-516.
"A Rule-Based System for Optimizing Combinational Logic" by A. J. de Geus et al., IEEE Design & Test, Aug. 1985, pp. 22-32.
"EXCL: A Circuit Extractor for IC Designs" by S. P. McCormick, IEEE 21st Design Automation Conf., 1984, pp. 616-623.
S. B. Akers, "A Procedure For Functional Design Verification", Report of 10th International Symposium on Fault Tolerant Computing Conference, 1980, pp. 1-34.

*Primary Examiner*—Vincent N. Trans
*Attorney, Agent, or Firm*—Kenyon & Kenyon

[57] ABSTRACT

When a hierarchy design is attempted in a logic design of a logic circuit, a system for verifying an equivalence between an upper level logic and a lower level logic is required. When the two different level logics are compared, the logics are once converted to Boolean expressions regardless of logic expressions of the logics, involving a logic circuit diagram and a truth table, and Shannon's formula is applied to the two Boolean expressions under a same order of variables to be extracted, to thereby produce binary decision diagrams (BDDs). When the equivalence between the produced BDDs is determined, the BDDs are simplified, respectively, and the simplified BDDs are integrated from the branches, and a determination can be carried out one time, i.e, without a repeat process.

10 Claims, 12 Drawing Sheets

FIG. 2A
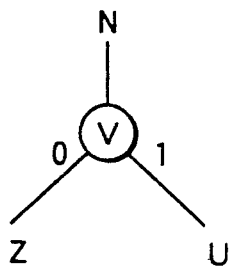
V=0: VALUE OF N = VALUE OF Z
V=1: VALUE OF N = VALUE OF U
FIG. 2B
$g = \bar{A}B + CD + \bar{B}\bar{D}$
$g_{A=0} = B + CD + \bar{B}\bar{D}$
$g_{A=1} = CD + \bar{B}\bar{D}$
$g_{A=0, B=0} = CD + \bar{D}$
$g_{A=0, B=1} = 1 + CD$
$g_{A=1, B=0} = CD + \bar{D}$
$g_{A=1, B=1} = CD$
$g_{A=0, B=0, C=0} = \bar{D}$ ⎱ 21
$g_{A=0, B=0, C=1} = 1$
$g_{A=0, B=1, C=0} = 1$
$g_{A=0, B=1, C=1} = 1 + D$
$g_{A=1, B=0, C=0} = \bar{D}$
$g_{A=1, B=0, C=1} = 1$
$g_{A=1, B=1, C=0} = 0$
$g_{A=1, B=1, C=1} = D$
FIG. 2C
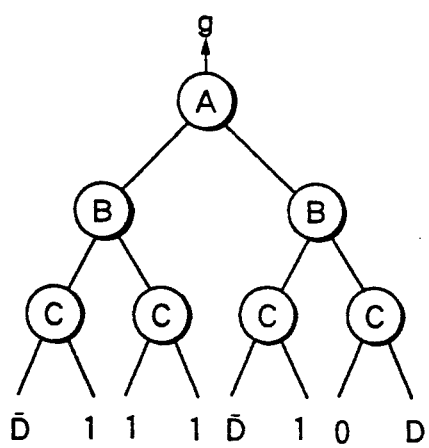
FIG. 2D
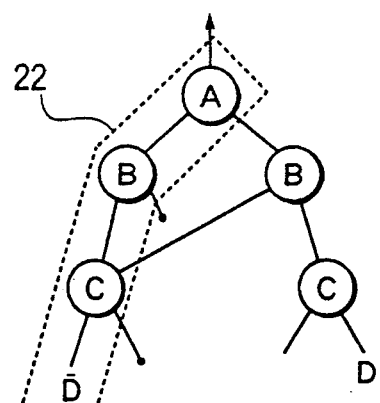

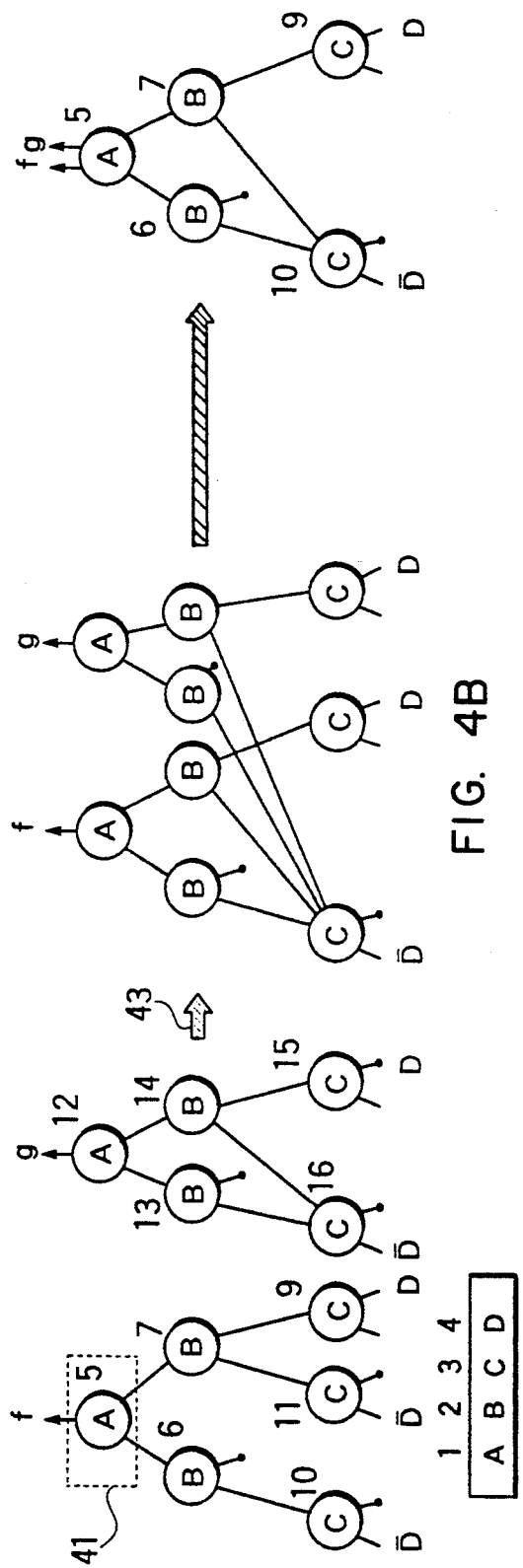
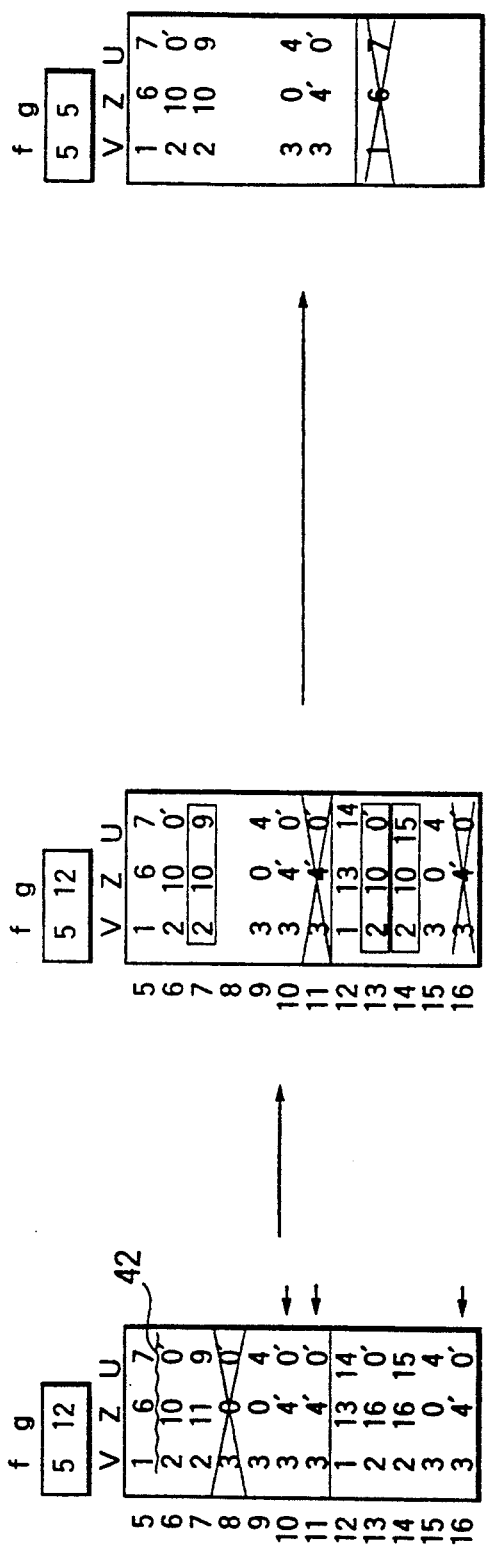
FIG. 4A
FIG. 4B

BOOLEAN EXPRESSION EXTRACTION

FIG. 10A

BDD PRODUCTION

START

MOVE BOOLEAN EXPRESSION FOR PRODUCING BDD TO TEMPORARY AREA — 301

SUBSTITUTE "0" AND "1" TO EXTRACTED VARIABLES, CALCULATE BOOLEAN EXPRESSION, AND STORE THE RESULTANT BOOLEAN EXPRESSION TO TEMPORARY AREA (THE CALCULATED EXPRESSIONS ARE DOUBLE) — 302

SELECT NEXT EXTRACTED VARIABLE — 303

DOES VARIABLE REACH n — 304 — NO

YES

ASSIGN NODES OF VARIABLES AND COMPLETE TREE TO STORAGE REGIONS — 305

WRITE FINAL RESULTS BY THE ABOVE CALCULATION TO STORAGE REGIONS CORRESPONDING TO BRANCHES OF EACH TERMINAL — 306

END

FIG. 10B

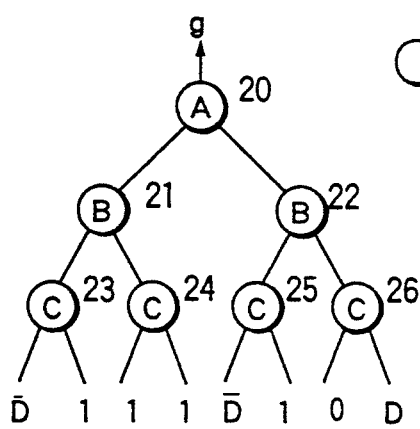

FIG. 10C

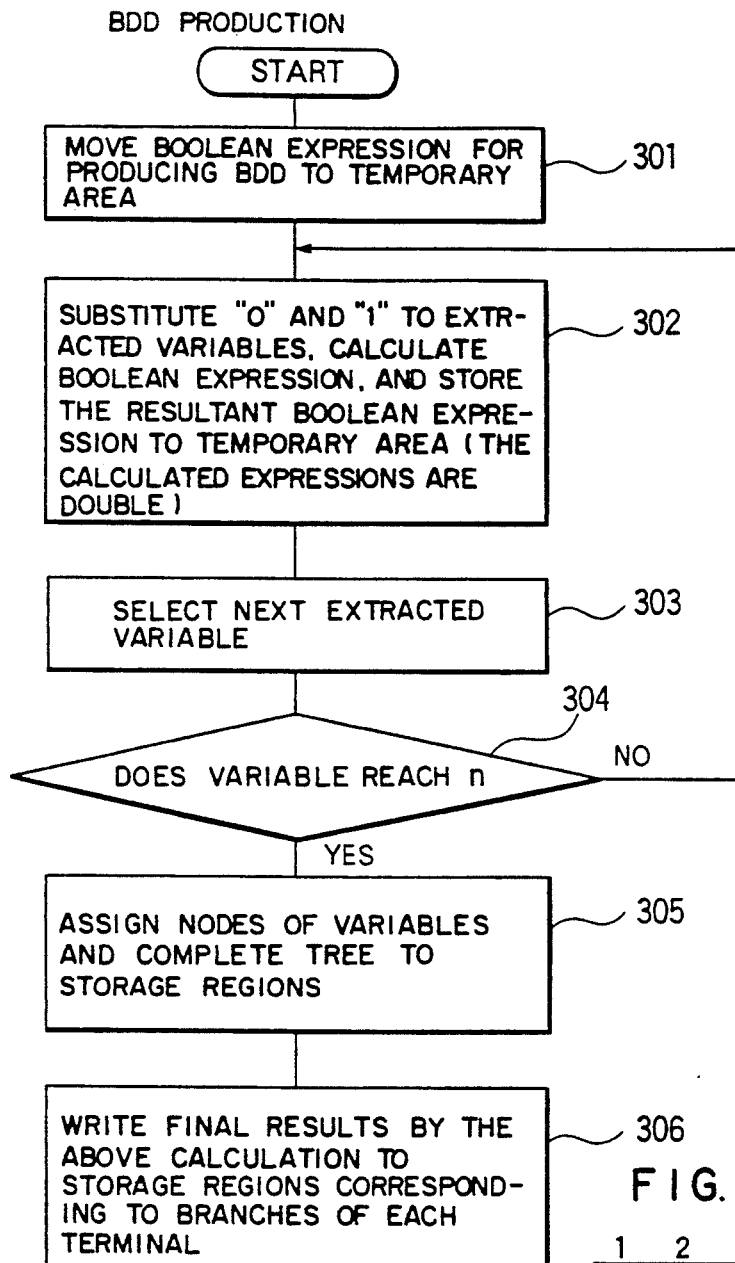

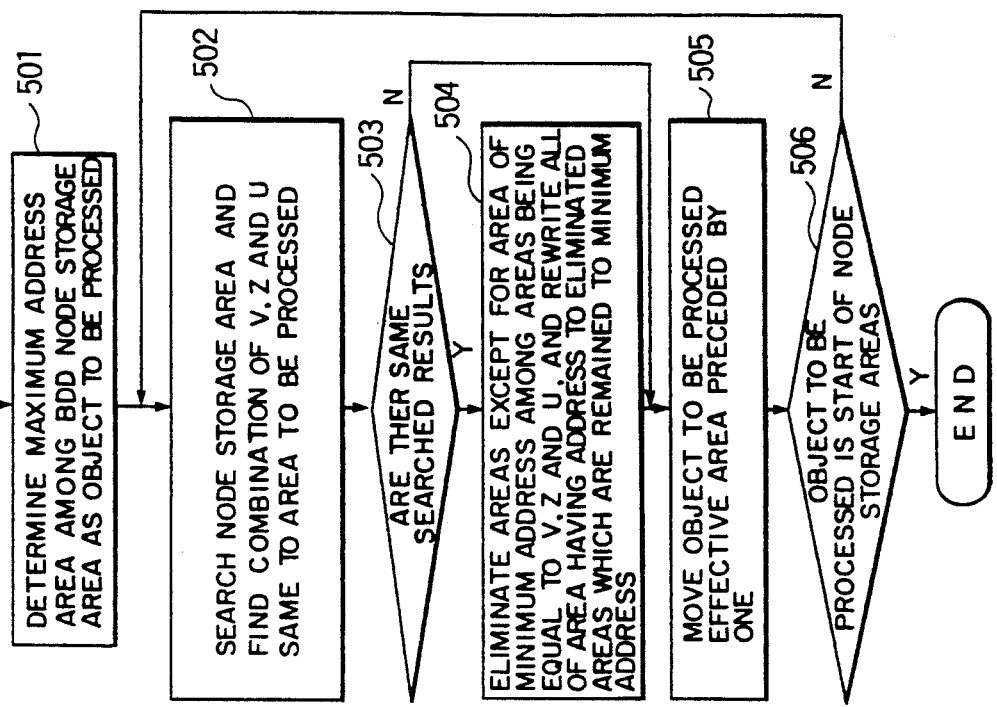
FIG. 12 BDD COMPARISON
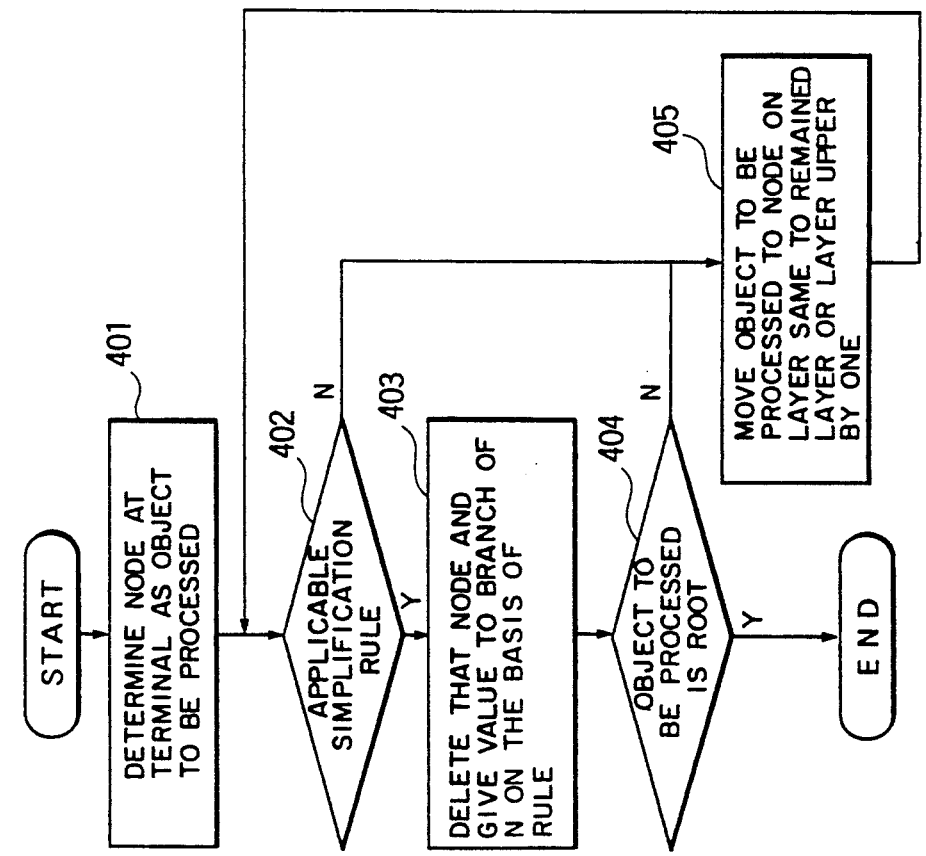
FIG. 11 BDD SIMPLIFICATION

FIG. 13A UPPER LOGIC
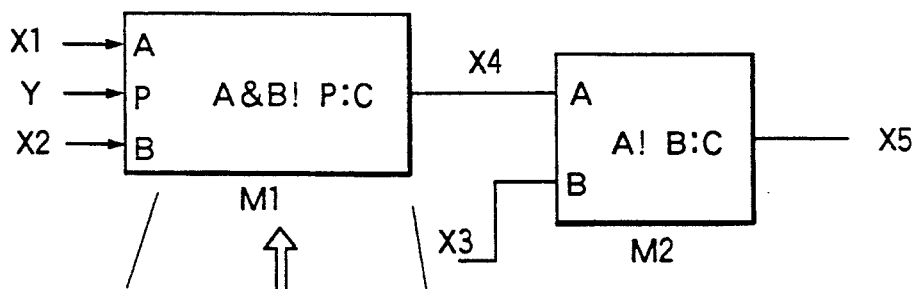
FIG. 13B LOWER LOGIC
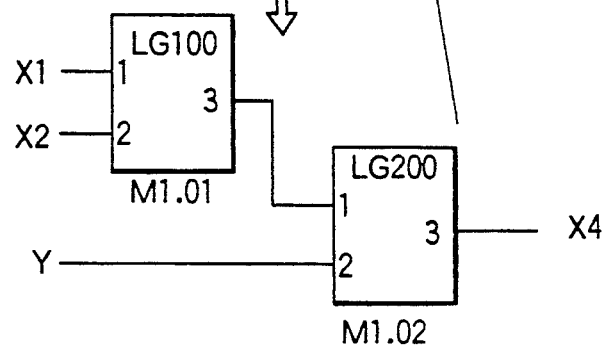
FIG. 13C DATA FORMATS OF UPPER LOGIC FILE
    GM M1 ;
        IN A=X1 ; P=Y ; B=X2 ;
        OUT C=X4
        BL A&B! P:C
    GM M2 ;
        IN A=X4 ; B=X3 ;
        OUT C=X5 ;
        BL A! B:C
FIG. 13D DATA FORMATS OF LOWER LOGIC FILE
    BM LG100 M1.01
        1=X1, 2=X2, 3=M1.0001
    BM LG200 M1.02
        1=M1.0001, 2=Y, 3=X4

COMPARISON AND VERIFICATION SYSTEM FOR LOGIC CIRCUITS AND METHOD THEREOF

BACKGROUND OF THE INVENTION

The present invention relates to a comparison and verification system by a computer, for comparing two logic circuits, preferably, upper and lower hierarchy logics in a hierarchy logic design, and a method thereof.

A logical design of a digital system is carried out with reference to a detailed logic drawing, and recently, a functional logic drawing in which contents ranked as an upper level than those in the above detailed logic are illustrated, has been frequently used. When the functional logic drawing is used for the logic design, a designer develops the functional logic drawing to the detailed logic drawing, and proceeds the design by a hierarchy manner. In the design procedure, a logical equivalence between the functional logic drawing ranked as an upper level and the detailed logic drawing ranked as a lower level must be verified.

There are the following methods of comparing and verifying an equivalence between an upper level logic and a lower level logic designed by a hierarchy logic, used by a computer, so far.

(i) A method in which a same test pattern is added to the upper logic and the lower logic to logically simulate same, and a coincidence check between the output patterns thereof is carried out.

(ii) A method in which Boolean expressions for output parameters are produced from the upper logic and the lower logic, converted into expressions by an addition standard form, and compared therebetween, or another method in which exclusive ORs of the Boolean expressions are obtained and compared same.

(iii) The upper logic and the lower logic are converted to logic forms, so called as a binary decision diagrams (BDDs), and an equivalence between the logic forms is verified.

The verification method on the basis of the BDD in above (iii) is dealt in, for example, S. B. Akers, "A PROCEDURE FOR FUNCTIONAL DESIGN VERIFICATION", Report of 10th International Symposium on Fault Tolerant Computing Conference. In this method BDDs are directly produced from a logical expression such as a logical circuit, a truth table or a Boolean expression, the processes of normalization, comparison, extraction and simplification are repeated to the produced BDDs by a plurality of times to carry out a comparison and verification.

The verification methods set forth above, however, suffers from the following disadvantages.

(i) In the method of comparing the results obtained by the logic simulation, a relatively long time is required for generating test patterns used for verifying a coincidence between the upper and lower layers.

(ii) In the method of comparing the Boolean expressions, a processing time and a required capacity of a memory respectively become order of N2, where N is the number of variables, as a result, if the number of the variables is increased, the method can not be substantially adopted.

(iii) In the method of using the BDD, a loop operation of the sequential processes such as the normalization, the comparison, the extraction and the simplification must be repeated until the coincidence is obtained, the processing time becomes K.N.log N, where K represents a repeat number, and N represents the number of nodes, and a very long processing time is required.

SUMMARY OF THE INVENTION

The present invention overcomes the above problems which occurred in the prior art and provides a logical circuit comparison and verification system. Comparison and verification is provided for two logic circuits, in particular, logics extracted by upper and lower levels and a determination is made as to whether or not the logics coincide, these functions are carried out at a high speed without an increase of memory regions to be used.

The logical circuit comparison and verification system according to the present invention has features, (a) to provide a Boolean expression extraction portion for converting all of logic 1 and logic 2 which are input to a computer and expressed by one of a Boolean expression, a truth table and a logic circuit to Boolean expressions, a binary decision diagram (BDD) production portion for producing binary decision diagrams by treating an order of variables obtained by Shannon's formula from the Boolean expression extracted by the Boolean extraction portion as a same order between the logic 1 and the logic 2, a BDD simplification portion for simplifying the BDDs during the production of the BDDs, and a BDD comparison portion for determining whether or not the two simplified BDDs are equivalent by comparing once. Also, (b), in the logic circuit comparison and verification system of the above (a), the comparison has a feature to have a function for comparing the two simplified BDDs while integrating the same from branches. Further, (c), in the logic circuit comparison and verification system of the above (a), logic 1 and the logic 2 are an upper level and a lower level, respectively, in a hierarchy logic design.

Furthermore, a method of comparing and verifying logic circuits according to the present invention has a feature (d) to convert logic 1 and logic 2 which are input to a computer and expressed by one of a Boolean expression, a truth table and a logic circuit is converted to Boolean expressions, to produce binary decision diagrams by treating an order of variables obtained by Shannon's formula as a same order of the logic 1 and the logic 2, to simplify the respective binary decision diagrams, to determine whether or not the simplified binary decision diagrams are coincided by a comparison of once. Also, the method of comparing and verifying on the basis of the binary decision diagram, according to the present invention has features (e), in the method of comparing and verifying an equivalence between logic 1 and logic 2, which are expressed by one form of a logic circuit, a truth table and a Boolean expression, to convert logic 1 and logic 2 to Boolean expressions, apply Shannon's formula to the logic 1 and the logic 2 at a same order, and compare same while integrating the produced binary decision diagrams from branches. Further, the method of comparing and verifying logic circuits in the above (d) has a feature (f) to read out logics to be compared and verified from the upper level and the lower level in a hierarchy logic design, then to create Boolean expressions from the read logics and compare and verify the logic circuits with reference to the created Boolean expressions, and, (g), when same functions of logic circuits are designed by a plurality of methods or by a plurality of designers, it is possible to introduce Boolean expressions from the designed logics, and to compare and verify the equivalence between the created Boolean expressions by using the method of comparing and verifying logic circuits in the above (d).

In the present invention, when two different levels of logic are compared, regardless of a logical expression of the logics including a logical circuit diagram, a truth table or the like, those expressions are once converted to Boolean expressions, to adjust an order same to obtained variables against the Boolean expressions, and produce BDDs by applying Shannon's formula. On the other hand, when the produced BDDs are determined as being equivalent, those are simplified, and thereafter, portions of common structures are integrated by the two BDDs from the branches to enable a loopless determination.

BRIEF DESCRIPTION OF THE DRAWINGS

FIGS. 2A-2D are views explaining a production process of BDDs in FIG. 1;

FIGS. 4A and 4B are views showing comparative examples of the BDDs in FIG. 1;

FIGS. 10A-10C are diagrams of a function of a BDD production part;

FIG. 11 is a flow chart of a function of a BDD simplification part;

FIG. 12 is a flow chart of a function of a BDD comparison part; and

FIGS. 13A-13D are views showing data formats of logical files.

DESCRIPTION OF THE PREFERRED EMBODIMENTS

Embodiments of the present invention will be described in more detail with reference to the accompanying drawings.

Figure 7:
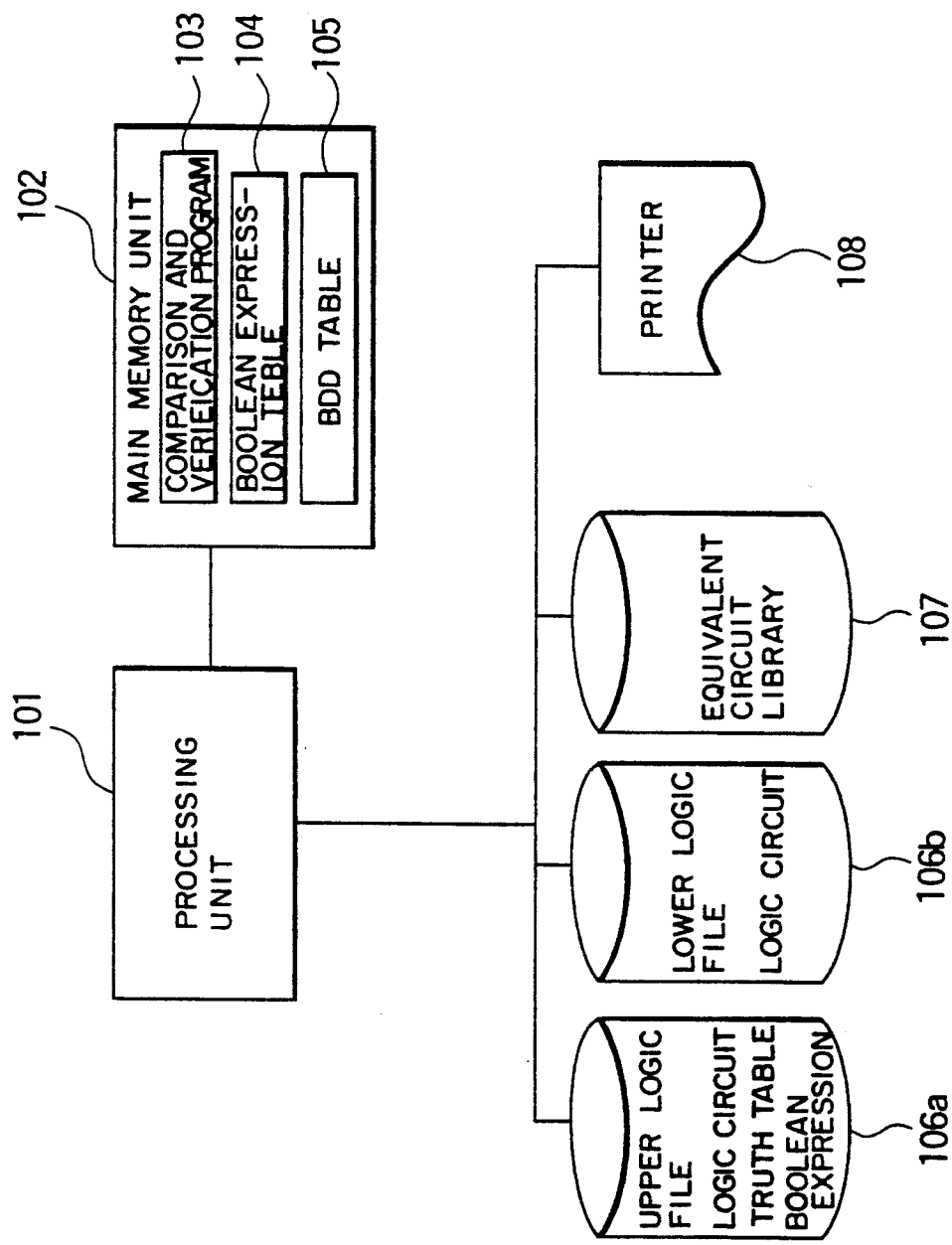
FIG. 7 is a hardware construction view of a logic circuit comparison and verification system.

FIG. 7 is a block diagram of a hardware construction of a logic circuit comparison and verification system according to the present invention (hereinafter, merely referred to as a system, involving relating systems).

First logics (logic 1) and second logics (logic 2) which are objects to be processed are stored in a magnetic disk storage unit as an upper logic file 106a and a lower logic file 106b, respectively. An equivalent circuit library 107 is a magnetic disk storage unit wherein Boolean expressions of parameter forms corresponding to logic circuit elements are stored. A main storage unit 102 stores a logic comparison verification program and is provided with a Boolean expression table 104 and a BDD table 105 to which the program is used. These tables are separated into an upper and a lower table, as described later. A processing unit 101 executes a logic comparison and verification processing in accordance with a logic comparison and verification program 103. The results of the comparison and verification are output from a printer 108 for outputting the result.

Figure 8:
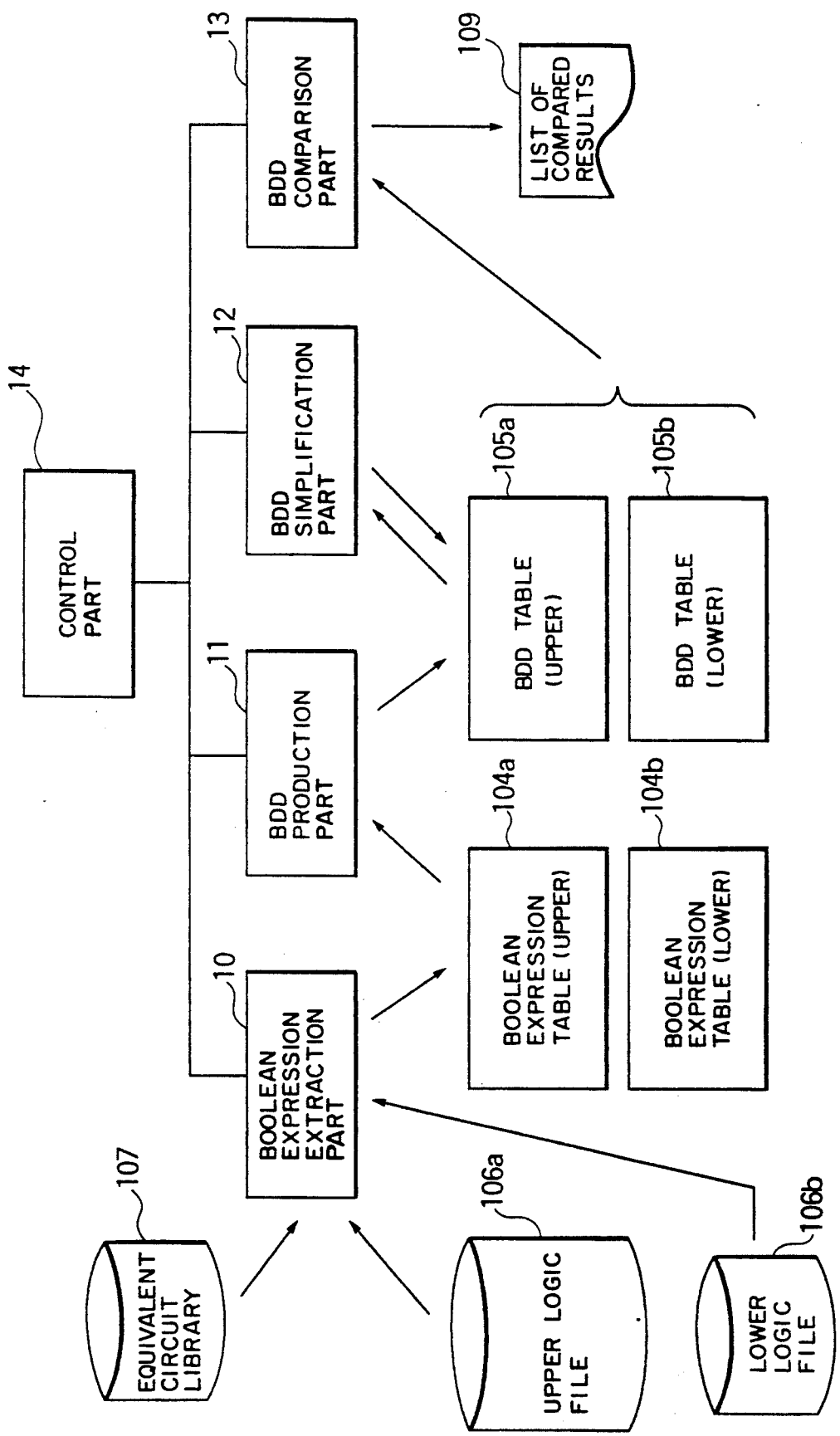
FIG. 8 is a software construction view of a logic circuit comparison and verification system according to the present invention.

FIG. 8 shows a construction of the logic comparison and verification program 103. A Boolean expression extraction portion 10 extracts Boolean expressions from the upper and lower logic files 106a and 106b expressed by a logic circuit, a truth table or a Boolean expression. When the Boolean expressions are extracted from the logic circuit, the equivalent circuit library 107 is referred to. The lower logic file normally stores only the logics of a logic circuit form. The extracted Boolean expressions are stored to a Boolean expression table 104a or a Boolean expression table 104b.

A BDD production portion 11 produces BDDs from the Boolean expressions in the Boolean expression tables 104a and 104b and stores them in the corresponding BDD tables 105a and 105b. These BDDs are simplified at a BDD simplification part 12 and compared at a BDD comparison part 13. The compared result is output by the printer 108 as a result output list 109.

A control part 14 carries out a control of start, stop or the like of each portion of the above program.

Functions and procedures of the Boolean expression extraction portion 10, the BDD production part 11, the BDD simplification portion 12 and the BDD comparison part 13 will be described in more detail.

Figure 1:
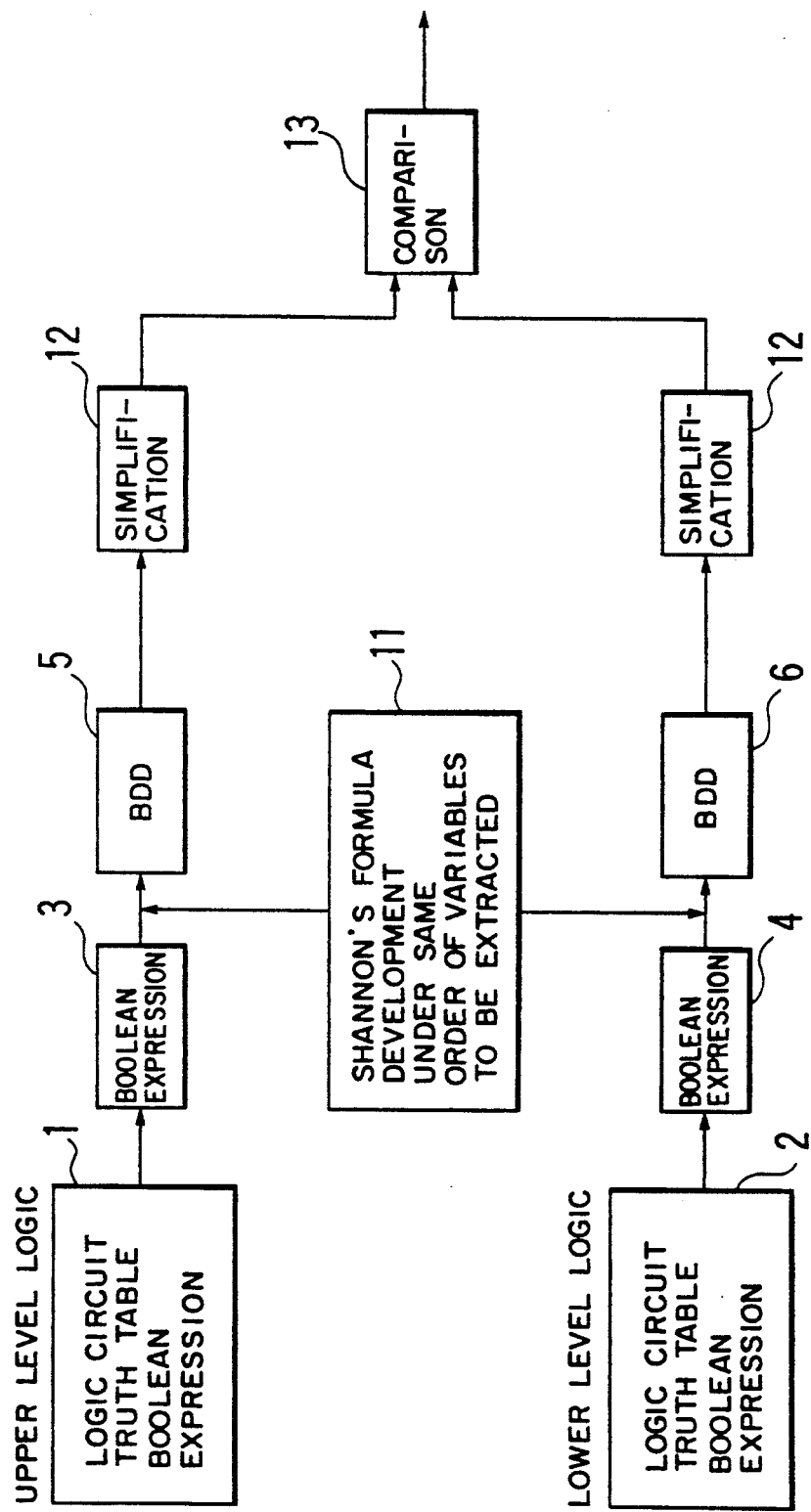
FIG. 1 is a flow chart of a process of a method of comparing and verifying logic circuits as an embodiment of the present invention.

FIG. 1 is a functional block diagram illustrating a flow of the processes of a method of comparing and verifying logic circuits according to the present invention.

As shown in FIG. 1, the logic circuit, the truth tables or the Boolean expressions 1 and 2 are converted to Boolean expressions 3 and 4 at each of the upper and lower level logics. The logic of the lower level is normally expressed only in logic circuit form. In the BDD production portion 11, a development by applying Shannon's formula to the two Boolean expressions under a same order of variables to be extracted. Note that Shannon's formula is expressed by a target formula f developed by a formula $f_{A=0}$ where an input Variable A therein is fixed at zero, and a formula $f_{A=1}$ where the input variable A is fixed at one:

$$f = A \cdot f_{A=0} + \overline{A} \cdot f_{A=1}$$

After production of BDDs 5 and 6, the BDD simplification portion 12 simplifies the BDDs and the BDD comparison part 13 compares the simplified BDDs.

If the verification of the logic of two different levels which are expressed by a variety of logic expressions is performed, when they are once converted to Boolean expressions, and the verification is carried out using the BDDs produced by extracting the variables in a same order and applying Shannon's formula, if a combinational logic circuit can be extracted as a single unit in any cases where the circuit in question has any forms, this method can be applied to each combinational logic circuits, and thus this method can be applied to a large scale LSI when a division hierarchy design where the LSI is treated as divided small circuits is adopted. Note that the combinational circuit means a logic circuit not having a data holding function such as a register or a flip-flop, but having a certain logical function.

The function of the Boolean expression extraction part 10 for carrying out the extraction of the Boolean expressions will be described with reference to FIGS. 9 and 13.

FIG. 13 shows examples of data formats of the upper logic file 106a and the lower logic file 106b which are input data to the Boolean expression extraction part 10.

FIG. 13A shows an example of an upper logic designed by a logic designer. Here, symbols X1, X2, Y, X3, X4 and X5 denote input or output signal names. Symbols M1 and M2 represent names of combination circuits (hereinafter, referred as a module) having a certain logical function. Symbols A, B, C and P denote parameters of module inputs or module outputs. These parameters can be deemed as input/output pins. Symbol & indicates a logical product (AND), and symbol ! indicates a logical sum (OR). Accordingly, the expression: A & B ! P : C indicates that the output C is a logical sum of a logical product of A and B, and P. Namely, this expression is a Boolean expression the output parameters of which are expressed by the input parameters. This upper logic is input to the system and stored in the upper logic file, and the data formats of the file are indicated in FIG. 13C. Symbol GMM1 represents that the data concerns to a module M1. IN A=X1 represents that a signal named as X1 is input to a parameter X1. OUT C=X4 represents that a signal named as X4 is output from a parameter C. Symbol BL represents that the expression is a Boolean expression.

FIG. 13B is a lower logic expressed by the logic circuit corresponding to the upper logic M1. Symbols X1, X2, Y and X4 denote input and output signal names. Numerals 1, 2 and 3 are input or output parameters. These parameters can be deemed as input and output pins. LG100 and LG200 represent names of fundamental modules having certain functions. M1.01 represents an identifier of a fundamental module in that logic circuit.

FIG. 13D shows a data format of a logic file of this logic circuit. BM denotes a fundamental module. 1=X1 indicates the relationship of a parameter and a signal name. M1.0001 denotes a signal name automatically given by the system. The system can not know that what kinds of logical functions do this fundamental module have, and which are input signals or output signals, through the lower logic file, per se.

Figure 9:
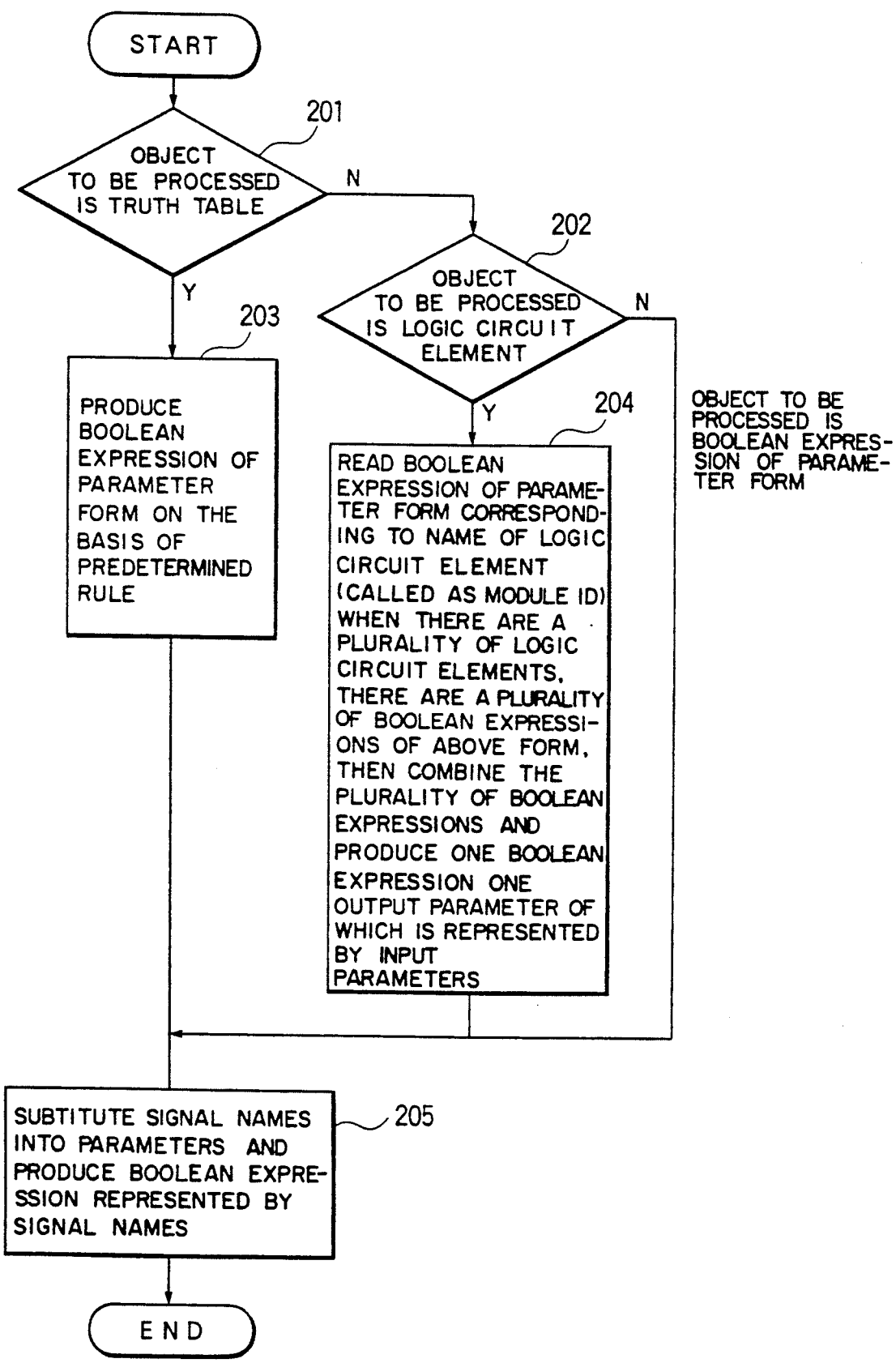
FIG. 9 is a flow chart showing a function of a Boolean expression extraction portion.

FIG. 9 shows a function of the Boolean expression extraction part.

At step 201 an object data to be processed in the logic file is read and determined whether or not it is of a truth table form. If it is not of the truth table form, the process is transferred to step 202, a determination for determinating whether or not it is of the logic circuit element. If it is not of the logic circuit element, the Boolean expression is defined (actually, a determination to determine whether or not it is the Boolean expression is carried out, but this determination is omitted in the drawing). When the object to be processed is the Boolean expression the process is transferred to step 205, signal names are inserted into the Boolean expressions represented by a parameter form to produce Boolean expressions marked by the parameter form. For example, in case of a general module M1 of FIG. 13A, the expression X4=X1 & X2 ! Y is produced.

The object to be processed is determined as the logic circuit element at step 202, the process is transferred to step 204. At step 204 the Boolean expressions corresponding to the names of the logic circuit elements, i.e., the names of the fundamental modules are read by the equivalent circuit library 107 of FIG. 8. For example, the Boolean expression of the parameter form: 3 =1 & 2 is stored in the equivalent circuit library 107, for example, a storage region corresponding to LG100.

At step 204 when the logic circuit is formed by a plurality of logic circuit elements, the Boolean expressions corresponding to the respective logic circuit elements are read from the equivalent circuit library, and combined to produce Boolean expressions output parameters of which are represented by input parameters.

At step 201 when the object to be processed is determined as the truth table, the process is transferred to step 203, parameter form Boolean expressions are produced in accordance with a predetermined rule, for example, a Boolean expression shown in the right below side can be produced from a truth table shown in the left below side.

Truth table    Boolean expressions $TT\ 3*3\ 2$
$-, B1, B2$
$A1, C0, C1, Z1$
$A2, C0, C1, Z2$ $\rightarrow$ $A1\ \&\ B1\ \&\ C0\ !\ A1\ \&\ B2\ \&\ C1\ =\ Z1$
$A2\ \&\ B1\ \&\ C0\ !\ A2\ \&\ B2\ \&\ C1\ =\ Z2$ A conversion rule is not of the subject matter of the present invention, thus the description thereof is omitted. The Boolean expressions produced at steps 203 and 204 are the parameter type Boolean expressions, the signal names are inserted into the parameters at step 205 to produce the Boolean expression represented by the signal names, and stored in the Boolean expression table 104a or 104b of FIG. 8.

FIG. 2 is a view explaining the process of the BDD production portion 11 in FIG. 1, and shows an example of a process for producing BDDs from the Boolean expressions.

FIG. 2A shows a fundamental element of the BDD as a general form, V being an abbreviation of a variable and meaning a node variable, Z being the number of node at a left below, and N being the Boolean expression. When V=0N becomes Z, and when V=1N becomes U. FIG. 2B shows the Boolean expressions when A, B, C and D are 1/0, respectively, and FIG. 2C shows the BDDs produced according to the calculated results of FIG. 2B. Here, an extraction order is the sequence of A, B, C and D. The BDDs have properties shown FIG. 2A, then the expression 21 of FIG. 2B is represented by a branch portion of 22 in FIG. 2D.

According to this principle, in FIG. 2B, a value of the Boolean expression g can be a variety of values in response to values of A, B, C and D in the expression $g=\overline{A}B+CD+\overline{B}D$. Namely, when A=0 the expression becomes $g=B+CD+\overline{BD}$, when A=1, the expression becomes $g=CD+\overline{BD}$, when A=0 and B=0, the expression becomes $g=CD+\overline{D}$, when A=0 and B=1, the expression becomes $g=1+CD$, when A=1 and B=0, the expression becomes $g=CD+\overline{D}$, when A=1 and B=1, the expression becomes $g=CD$, when A=0, B=0 and C=0, the expression becomes $g=\overline{D}$, when A=0, B=0 and C=1, the expression becomes $g=D+\overline{D}=1$, when A=0, B=1 and C=0, the expression becomes $g=1$, when A=0, B=1 and C=1, the expression becomes $g=1+D=1$, when A=1, B=0 and C=0, the expression becomes $g=\overline{D}$, when A=1, B=0 and C=1, the expression becomes $g=D+\overline{D}=1$, when A=1, B=1 and C=0, the expression becomes $g=0$, or when A=B=C=1, the expression becomes $g=D$.

FIG. 2C shows a total structure of the BDDs of the expression g obtained by the above conditions. In the drawing, for example, when A=B=C =0, left side branches are selected to obtain the Boolean expression g=$\overline{D}$. The BDDs shown in FIG. 2D are produced by applying the simplification discussed later to the developed results shown in FIG. 2B. Blacken dots show one (1). FIG. 10 shows a flow chart of the above BDD production process.

In FIG. 10A, at step 301 Boolean expressions for producing BDDs are read from the Boolean expression table 104a or 104b and stored to a temporary area on the main memory unit 102. Values 0 and 1 are inserted into the variables to be extracted of the Boolean expressions in the temporary area to calculate the expressions, and the resultant values are stored to the temporary area. The number of the expressions become double, i.e., the expressions inserted by 0 and the expressions inserted by 1 (step 302).

At step 303, variables to be next extracted are designated. Assuming that there are n variables, at step 304 a determination whether or not the order of the variable is the n-th order is carried out. If the order of the variable is below the (n-1)th order, the process of step 302 is repeated. If the variable reaches the n-th order the process is transferred to step 305, storage region is assigned to a node of the variable and a complete BDDs, they are stored, and at step 306 the final results obtained at step 302 are written in the storage regions corresponding to the terminal branches. As shown by 105a and 105b in FIG. 8 these storage regions are the upper logic BDD table and the lower logic table.

The store status of the BDD tables, for example, the BDDs shown in FIG. 2C will be described with reference to FIGS. 10B and C.

FIG. 10B shows the BDDs identical to those in FIG. 2C, but the node numbers are attached to right shoulder portions. The node numbers indicate addresses of the storage regions of the nodes, for the sake of convenience in this embodiment of the present invention. FIG. 10C shows that the BDDs are stored in the memory regions.

The variables A, B, C and D are stored in the addresses 1, 2, 3 and 4 of the storage regions. The node number "20" of a root is stored in a root number storage region, and this shows that the node storage region begins with the address of 20. The address of the node variable V, the node number Z of the left below and the node number U of the right below are stored to each address of the node storage regions, where zeros in the storage regions of Z and U indicate the constant of 0 and 0's indicate the negative value of 0, i.e., 1, and '(dash or prime) added in addition to 0 indicates the negative value of the value of Z or U. For example, referring to the node number 23 (the address of 23), V indicates a certain variable, since Z is 4' this indicates that Z is the negative value D of the variable D of the address of 4, and since U is 0' this indicates that U is the constant of 1.

Figure 3A:
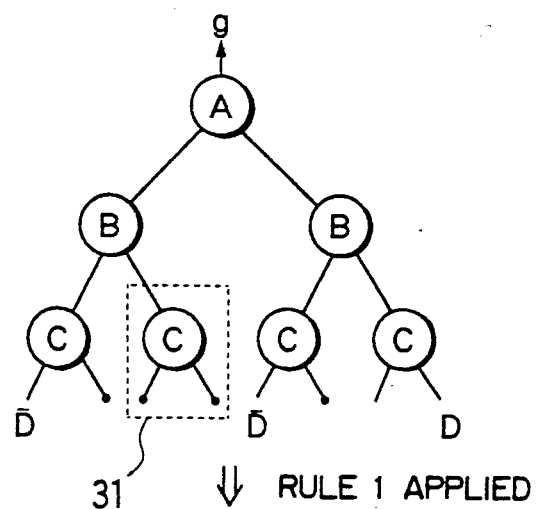
FIGS. 3A and 3B are views explaining a simplification of the BDDs in FIG. 1.
Figure 3B:
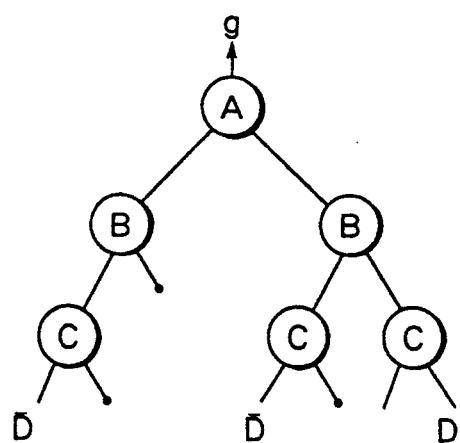

FIG. 3 is a view explaining the process of the BDD simplification portion in FIG. 1, FIG. 3A shows the simplification rules and FIG. 3B shows an example of the simplification thereof.

According to the rule 1 of FIG. 3A, when Z of the left below and U of the right below are equal the Z of the left below is combined with N of the upper portion to simplify it, i.e., the node variable can be simplified. According to the rule 2, when the negative values of Z of the left below and U of the right below are the both zeros the node variable V becomes the Boolean expressions N. According to the rule 3, when the negative values of Z of the left low and U of the right low are the both ones the negative value of the node variable V becomes the Boolean expression N.

FIG. 3B shows that a portion 31 shown by a dotted line becomes one (1) regardless of C=0 or C=1, therefore, the rule 1 of FIG. 3A is applied thereto to eliminate the variable C and directly connect the variable B, and to thereby simplify same. This simplification enables a shortening of the processing time of the comparison at a next step. FIG. 11 shows this function of the BDD simplification part 12.

At step 401 in FIG. 11 the terminal node having the maximum node number is selected as the object to be processed. At step 402 a determination whether or not the simplification rules shown in FIG. 3A can be applied thereto is carried out. If applicable the process is transferred to step 403, the corresponding node is deleted and a value is added to a branch (branch N) upper of the node in accordance with the above rules.

If the determination made in step 402 is that the simplification rules are not applicable the process is transferred to step 405, the object to be processed is moved to the node having a smaller number among the remained nodes within a same layer, and the node having the maximum number existing in a next upper layer if there is no nodes existing in the same layer, and then the process is restored to step 402. At step 404 a determination whether or not the object to be processed is the root is made and the simplification is terminated when it is the root, otherwise, the process is proceeded to step 405 to repeat the above processes.

After completion of the simplification, the comparison is carried out as shown in FIG. 1.

FIG. 4 is a view showing an example of the process in the BDD comparison part 13, the upper shows processes how the comparison is carried out by the integration, and the lower shows models of storage regions when the BDDs are handled in a computer system. Since the two BDDs to be compared are already simplified as mentioned above, the BDDs are not the BDDs having the maximum structure shown in FIGS. 10B and C, and accordingly the memory regions are also reduced at the minimum size.

The node of the BDD enclosed by a dotted line 41 on the upper portion in FIG. 4 is the node number of 5, and the node corresponds to the address of 5 of the memory region (the region is represented by 42), in this example. Records of V, Z and U are stored to the addresses of the memory region, V indicating the node variable, Z indicating the node number of the left below, and U indicating the node number of the right below, respectively. This is the same as that of FIGS. 10B and C.

In this example, the variables A, B, C and D are stored to the addresses of 1, 2, 3 and 4 of the memory region, then now considering the node 5 as an example, under the variable A, the node number 6 of the left below and the node number 7 of the right below, V=1, Z=6 and U=7 are stored to the memory region, respectively. On the lower in FIG. 4, 0 indicates the constant of zero and '(prime) indicates the negative value of the variable or the constant, as described above.

The comparison part integrates the BDDs described later and qualifies the equivalence between the BDDs. Here the BDD is formed so that the BDD having a smaller node number is placed in an upper layer.

(a) First, the node search is carried out to find a same structure from the node having the maximum node number within the two BDDs (f, g). Second, all of the node numbers of the nodes having the same structure among the found nodes having the same structure is replaced by the smallest number of the node. For example, at a process 43 the nodes having the same structure of the node 16 are searched as the node having the maximum node number, and then the node 10 and the node 11 are found. The node number 10 having the small number is adopted, and the nodes 11 and 16 are replaced by this 10th node. To indicate this replacement liens are drawn between the number 7 of the variable B connected to the number 11 and the number 13 of the variable B connected to the number 16, and between the number 14 and the number 10, respectively. Alternatively, the regions storing the number 11 and the number 16, i.e., Z of the node number 7, Z of the node number 13 and Z of the node number 14 are all replaced by the number 10 (see the node numbers 7, 13 and 14 enclosed by a middle frame of the lower portion). In addition, the nodes numbers 11 and 16 are deleted (see, the node numbers 11 and 16 marked by an X mark).

(b) All of the nodes of one BDD is sequentially applied by the above (a). For example, the node 9 as the node having the same structure to the node 15, the node 7 as the node having the same structure to the node 14, and the node 6 as the node having the same structure to the node 13 are found, and then the node numbers 13, 14 and 15 are deleted from the memory region. Further, the node 5 as the node having the same structure to the node 12 is found, and the node 12 is deleted from the memory region.

(c) Through the processes of the above (b), when two node storage regions of the roots of the BDDs (f and g in FIG. 4) are coincided, the equivalence is verified. If the equivalence is not obtained, the processes of the above (a) will be not continued before the coincidence is obtained.

FIG. 12 shows a flow chart of this function of the BDD comparison part.

At step 501 an area having the maximum address among the BDD node storage regions is chosen as an object to be processed. At step 502 the node area is searched to find an area of the object to be processed and a combination same to a combination of v, Z and U. At step 503 a determination whether or not there are same ones. If there is the same ones the process is transferred to step 504, areas having same V, Z and U, except for the area having the minimum address, are deleted, and the nodes having the address same to the address of the deleted nodes, among the remained nodes are re-written to the above minimum address, and the process is transferred to step 505. If any same area is not found in the search of step 503, the process is transferred to step 505 the object to be processed is moved to an effective area proceeded by one. At step 506 the object to be processed is compared with the value of the root number storage region to determine whether or not the object is placed at a start of the node storage area. If the object is placed at the start of the node storage area the process is terminated. In this condition, if the two node storage regions of the roots of the BDDs are coincided, this means that the equivalence is proved. At step 506, if the object to be processed is not the start of the node storage region, the process is returned to step 502 and the above processes will be repeated.

Figure 5:
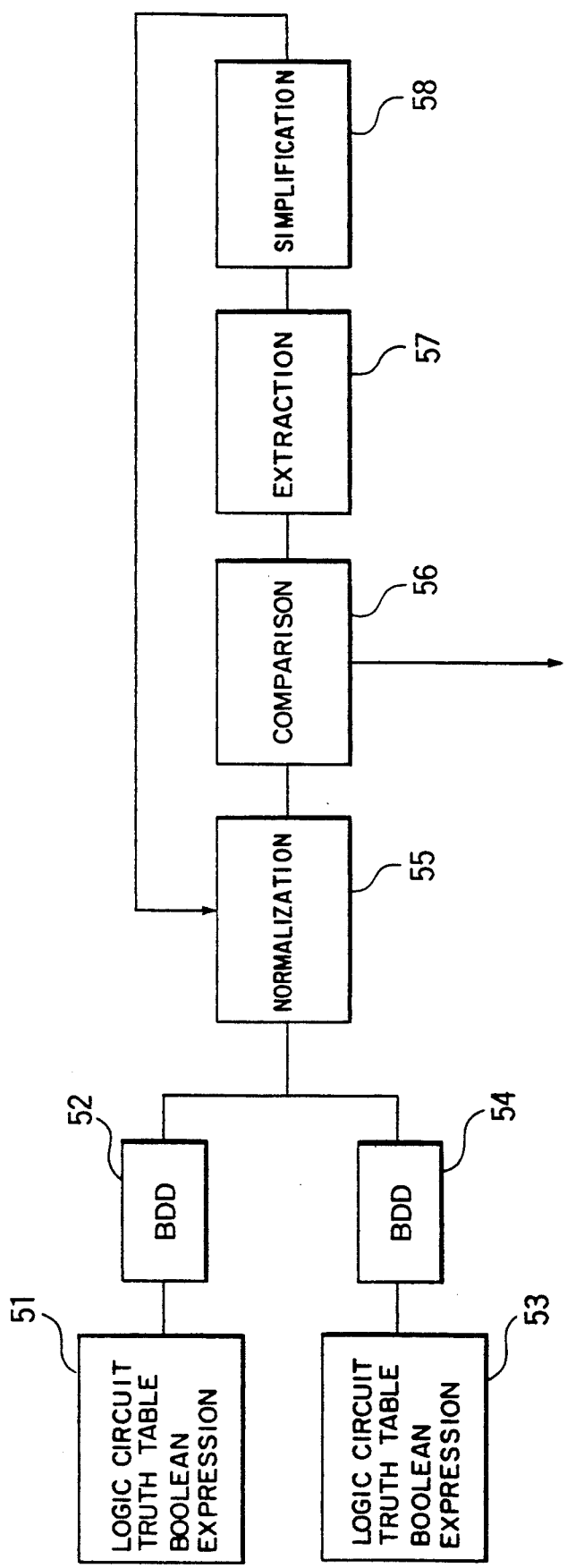
FIG. 5 is a flow chart of a process of a BDD verification method obtained in a process to reach the present invention.

Referring to FIG. 5, matters 51 and 52 represented by the logic circuit and the truth table of a lower level or the Boolean expression of an upper level are respectively converted to BDDs at BDD generation parts 52 and 53, normalized at a normalization part 55 and are both compared at a comparison part 56. An extraction process at an extraction part 57 and a simplification process at a simplification part 58 are repeated, then a verification to determine whether or not both coincide is carried out at the comparison part 56, and thereafter the process is terminated.

This comparison method mentioned above completely differs from the BDD comparison method shown in FIG. 5. Namely, in this method, the normalization of the BDDs and the substitution of the variables are not required, the verification is achieved by replacing the branches of the BDDs. This logic equivalence verification is carried out to a logic composed by output signal lines in one LSI at each unit of a combinational circuit having certain functions. The input signal lines of the module are the input variables of the Boolean expressions.

Figure 6:
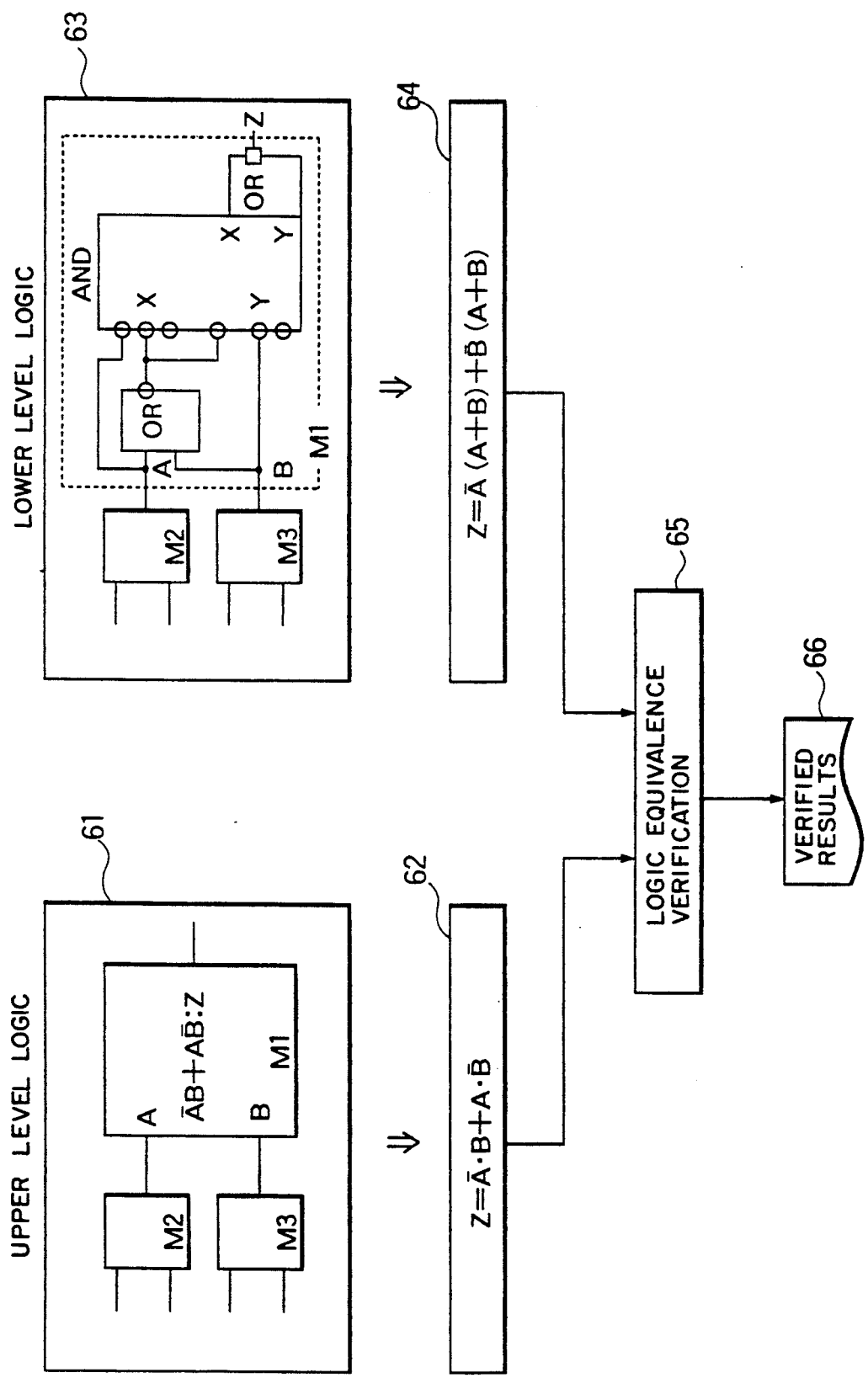
FIG. 6 is a flow chart showing a logic circuit comparison and verification system as an application of the present invention.

FIG. 6 is a flow chart of processes of a logic verification system employed by the verification method of the present invention.

Assuming that an upper level logic 61 and a lower level logic 63 have structure as shown in FIG. 6, Corresponding modules are picked up from the two upper and lower logics, a circuit is traced from output signals thereof to produce Boolean expressions 62 and 64. The method 65 of comparing and verifying logic circuits according to the present invention is applied to the produced Boolean expressions 62 and 64 to output a verified result 66.

In FIG. 6 M1 in the upper level logic 61 corresponds to M1 of the lower level logic 63, then the Boolean expression 62: $Z = \overline{A}B + A\overline{B}$ is produced from the upper level logic 61 and the Boolean expression 64 : $Z = \overline{A}(A+B) + \overline{B}(A+B)$ is produced from the lower level logic 63.

As can be seen from the above, the logical comparison for the upper and lower level logics in the hierarchy logic design can be realized.

As another embodiment of the present invention, when logic circuits realizing a same function are designed by a different method, by commonly designing signal names of inputs and outputs, two circuits can be compared and verified by applying the method of the present invention. Specifically, when the upper level logics and the lower level logics in FIG. 6 are designed by different methods but are the logic circuits having the same function, these are compared and verified by the completely same method.

As still another embodiment of the present invention, when logic circuits having a same function are designed by a plurality of designers, the method shown in FIG. 6 can be applied. Specifically, when the upper level logic and the lower level logic shown in FIG. 6 are logic circuits designed by two different designers, these circuits are also compared and verified in the completely same way as mentioned above.

Furthermore, according to the verification method of the present invention, the comparison and judgement is carried out at a high speed. For example, when the number of the variables is 20, the speed in the prior art is K, but the speed of the present invention is improved ten times over that of the prior art: K/10.

As described above, according to the present invention, compared with the prior art method, when the comparison and verification for the equivalence between the upper and lower layer logics is carried out in the hierarchy logic design, the verification and coincidence of the logics extracted from each of the logics is carried out at a high speed without an increase of the memory regions to be used.

We claim:

1. A system for comparing and verifying an equivalence between two logic circuits, comprising:
    a storage device storing a first logic corresponding to a first of said two logic circuits and a second logic corresponding to a second of said two logic circuits, said first and second logics expressed by a logic circuit form, a truth table form or a Boolean expression form;
    a Boolean expression extractor converting said stored first and second logics to Boolean expressions;
    a binary decision diagram (BDD) production device applying Shannon's formula to said produced Boolean expressions under a same order of variables to be extracted, and producing BDDs;
    a BDD simplification device simplifying said BDDs;
    a comparator comparing said simplified BDDs and producing a signal in response to said comparing, said signal indicating said equivalence between said two logic circuits; and
    a controller controlling a start and stop of said Boolean expression extractor, said BDD production device, said BDD simplification device and said comparator.

2. A system for comparing and verifying an equivalence between two logic circuits according to claim 1, wherein said comparator integrates and compares said two BDDs simplified by said BDD simplification device from branches.

3. A system for comparing and verifying an equivalence between two logic circuits according to claim 1, wherein said first and second logics are an upper level logic and a lower level logic in a hierarchy logic design.

4. A system for comparing and verifying an equivalence between two logic circuits according to claim 1, wherein said system is included within a computer.

5. A system for comparing and verifying an equivalence between two logic circuits according to claim 1, further comprising a storage device storing Boolean expressions of parameter forms corresponding to logic circuit elements of said two logic circuits, wherein said Boolean expression extractor converts said stored first and second logics to Boolean expressions based on said Boolean expressions stored in said storage device.

6. A method of comparing and verifying an equivalence between two logic circuits, comprising the steps of:
    storing in a first storage device first and second logics corresponding to a first and a second of said two logic circuits and which are expressed by a logic circuit form, a truth table form or a Boolean expression form;
    storing Boolean expressions of parameter forms corresponding to logic circuit elements of said two logic circuits in a second storage device;
    extracting Boolean expressions by converting said stored first and second logics to Boolean expressions based on said stored Boolean expressions of parameter forms;
    producing a binary decision diagram (BDD) by applying Shannon's formula to said extracted Boolean expressions under a same order of variables to be extracted, to produce BDDs;
    simplifying said BDDs; and
    comparing said simplified BDDs and providing a signal in response to said comparing which indicates said equivalence between said two logic circuits.

7. A method of comparing and verifying an equivalence between two logic circuits according to claim 6, wherein all of said first and second logic expressions are converted to Boolean expressions and said BDDs are produced by applying Shannon's formula to said Boolean expressions under the same order of said variables to be extracted, and said produced two BDDs are compared together with said two BDDs are integrated from the branches.

8. A method of comparing and verifying an equivalence between two logic circuits according to claim 6, wherein said first and second logics are an upper level logic description and a lower level logic description for a same logic in a structural logic design method.

9. A method of comparing and verifying an equivalence between two logic circuits according to claim 6, wherein said storing, extracting, producing, simplifying and comparing steps are implemented by a computer.

10. A method of comparing and verifying an equivalence between two logic circuits which are to have a same function and are designed by a plurality of methods or by a plurality of designers, said method comprising the steps of:
    storing in a first storage device logics corresponding to said designed logics;
    storing Boolean expressions of parameter forms corresponding to logic circuit elements of said two logic circuits in a second storage device;
    producing Boolean expressions from said stored logics based on said stored Boolean expressions of parameter forms;
    applying Shannon's formula to said produced Boolean expressions under a same order of variables to be extracted, to produce binary decision diagrams (BDDs);
    simplifying said produced BDDs; and
    comparing said simplified BDDs to provide a signal indicating said equivalence between said two logic circuits.

* * * * *

REEXAMINATION CERTIFICATE (2723th)

United States Patent [19]

Okuzawa et al.

[11] B1 5,243,538

[45] Certificate Issued Nov. 7, 1995

[54] COMPARISON AND VERIFICATION SYSTEM FOR LOGIC CIRCUITS AND METHOD THEREOF

[75] Inventors: Osamu Okuzawa, Hadano; Kazuhiko Matsumoto, Yokohama; Yukio Ikariya, Hiratsuka; Hiroshi Mochizuki, Hadano, all of Japan

[73] Assignee: Hitachi, Ltd., Tokyo, Japan

Reexamination Request:
No. 90/003,556, Aug. 29, 1994

Reexamination Certificate for:
Patent No.: 5,243,538
Issued: Sep. 7, 1993
Appl. No.: 563,492
Filed: Aug. 7, 1990

[30] Foreign Application Priority Data

Aug. 9, 1989 [JP] Japan ................................. 1-206090

[51] Int. Cl.⁶ ................................................. G06F 17/50
[52] U.S. Cl. ............................................ 364/489; 364/488
[58] Field of Search .................................... 364/488, 489, 364/490, 491

[56] References Cited

PUBLICATIONS

Randal E. Bryant, *Graph–Based Algorithms for Boolean Function Manipulation*, IEEE Transactions on Computers, vol. C–35, No. 8, Aug. 1986, pp. 677–691.

Randal E. Bryant, *Symbolic Manipulation of Boolean Functions Using a Graphical Representation*, 22nd Design Automation Conference, pp. 688–694.

*Primary Examiner*—Vincent N. Trans

[57] ABSTRACT

When a hierarchy design is attempted in a logic design of a logic circuit, a system for verifying an equivalence between an upper level logic and a lower level logic is required. When the two different level logics are compared, the logics are once converted to Boolean expressions regardless of logic expressions of the logics, involving a logic circuit diagram and a truth table, and Shannon's formula is applied to the two Boolean expressions under a same order of variables to be extracted, to thereby produce binary decision diagrams (BDDs). When the equivalence between the produced BDDs is determined, the BDDs are simplified, respectively, and the simplified BDDs are integrated from the branches, and a determination can be carried out one time, i.e, without a repeat process.

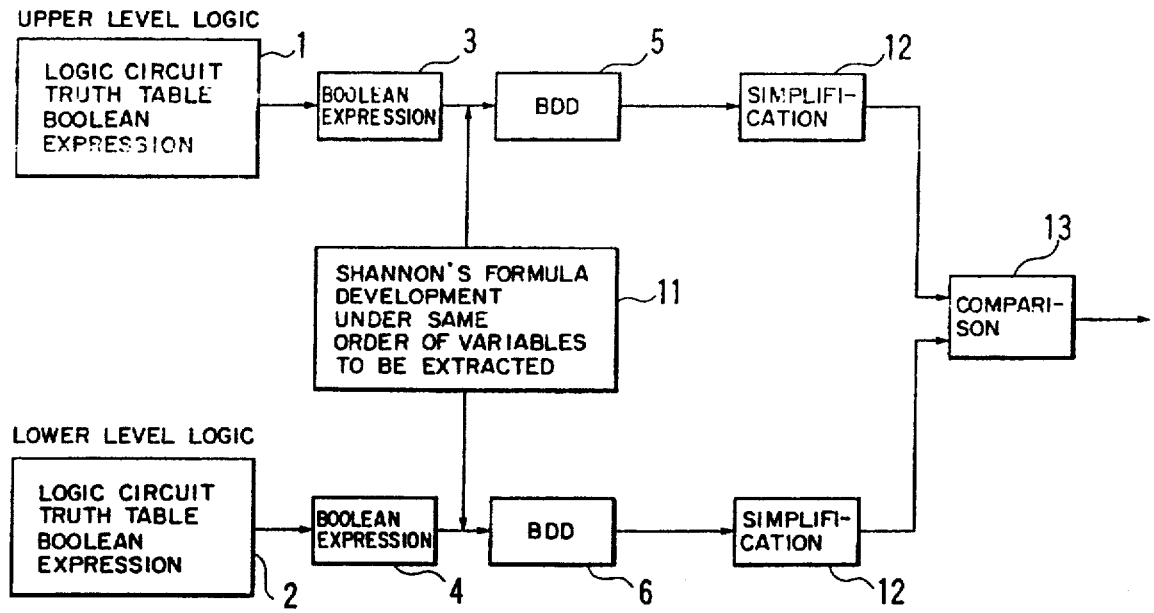

REEXAMINATION CERTIFICATE ISSUED UNDER 35 U.S.C. 307

NO AMENDMENTS HAVE BEEN MADE TO THE PATENT.

AS A RESULT OF REEXAMINATION, IT HAS BEEN DETERMINED THAT:

Claims 1–10 are cancelled.

* * * * *